United States Patent [19]
Fujimoto et al.

[11] Patent Number: 6,122,214
[45] Date of Patent: Sep. 19, 2000

[54] SEMICONDUCTOR MEMORY

[75] Inventors: Tomonori Fujimoto; Kiyoto Oota, both of Osaka, Japan

[73] Assignee: Matsushita Electric Industrial Co., Ltd., Osaka, Japan

[21] Appl. No.: 09/273,474

[22] Filed: Mar. 22, 1999

[30]     Foreign Application Priority Data

Mar. 23, 1998   [JP]   Japan ................................. 10-073625

[51] Int. Cl.$^7$ .................................................. G11C 7/00
[52] U.S. Cl. ............................................................ 365/222
[58] Field of Search ................................ 365/222, 194, 365/233, 236

[56]               References Cited

U.S. PATENT DOCUMENTS

| | | | |
|---|---|---|---|
| 4,672,583 | 6/1987 | Nakaizumi | 365/222 |
| 4,716,551 | 12/1987 | Inagaki | 365/222 |
| 4,961,167 | 10/1990 | Kumanoya et al. | 365/222 |
| 5,315,557 | 5/1994 | Kim et al. | 365/222 |
| 5,321,662 | 6/1994 | Ogawa | 365/222 |
| 5,349,562 | 9/1994 | Tanizaki | 365/222 |
| 5,818,777 | 10/1998 | Seyyedy | 365/222 |
| 6,002,629 | 12/1999 | Kim et al. | 365/222 |

FOREIGN PATENT DOCUMENTS

| | | |
|---|---|---|
| 64-13292 | 1/1989 | Japan . |
| 6-275071 | 9/1994 | Japan . |

*Primary Examiner*—Trong Phan
*Attorney, Agent, or Firm*—Eric J. Robinson; Nixon Peabody LLP

[57]                    ABSTRACT

In addition to a pulse train of a refresh request (RRQ) signal requesting for refresh per memory row, a self-refresh mode (SRMOD) signal is applied to a refresh control circuit. As soon as the SRMOD signal makes a transition from LOW to HIGH, an oscillation circuit starts generating a clock pulse train. In response to this clock pulse train, a set pulse is generated. A flip-flop circuit is set by the set pulse and a leading edge of a periodic refresh request (PRRQ) signal pulse is generated. Every time the PRRQ signal becomes HIGH, a reset pulse is generated, the flip-flop circuit is reset by the reset pulse, and a trailing edge of the PRRQ signal pulse is generated. Such arrangement provides a memory having a novel refresh input specification capable of reducing a burden of logic circuits for controlling access of the memory.

13 Claims, 6 Drawing Sheets

SEMICONDUCTOR MEMORY

BACKGROUND OF THE INVENTION

The present invention relates to a semiconductor memory having a memory cell array needing an operation called refresh, and particularly relates to an improvement in a refresh control circuit.

It is generally known that refresh is essential to dynamic random access memories (DRAMs) having memory cells formed by respective capacitors. A typical DRAM refresh control circuit employs RAS (row address strobe) and CAS (column address strobe) signals. More specifically, there are some refresh methods including a RAS-only refresh and a CBR (CAS-before-RAS) refresh.

Self-refresh is suitable for power-down modes such as a DRAM battery back-up mode. In the DRAM, an internal timer automatically generates refresh request signal pulses at periodic intervals and an internal counter automatically generates refresh addresses. CBR self-refresh is the current standard specification, wherein in a CBR refresh, a self-refresh mode is made to begin by maintaining both RAS and CAS signals at their activation level (LOW level) for 100 microseconds or more.

A conventional semiconductor memory is configured to perform a refresh operation on the basis of RAS and CAS signals received from a logic circuit for controlling access of the semiconductor memory. This accordingly requires the logic circuit to perform sophisticated control operations such as controlling timing of generating a leading edge of a first pulse to be applied as a CAS signal, a leading edge of a second pulse to be applied as a RAS signal, and a trailing edge of the second pulse.

SUMMARY OF THE INVENTION

A major object of the present invention is to provide a semiconductor memory having a novel refresh input specification, thereby reducing a burden of logic circuits for controlling access of the semiconductor memory.

Another object of the present invention is to accelerate the beginning of the first refresh operation in a self-refresh mode.

Still another object of the present invention is to prevent individual refresh request signal pulses from not being reset erroneously.

In order to achieve the major object, the present invention employs a refresh input specification for a semiconductor memory with first and second terminals, the first terminal receiving individual pulses of a refresh request signal and the second terminal receiving a self-refresh mode signal independently of the first terminal. The semiconductor memory contains a refresh control circuit which controls refresh of one row in a memory cell array every time one pulse of the refresh request signal is applied at the first terminal. In addition, in response to transition of the self-refresh mode signal, applied at the second terminal, from a first logical level to a second logical level, the refresh control circuit controls refresh of a plurality of rows in the memory cell array. The semiconductor memory of the present invention may be implemented by a memory which is mounted on a single semiconductor chip together with a logic circuit for the application of individual pulses of a refresh request signal and a self-refresh mode signal at the first terminal and at the second terminal, respectively.

The refresh control circuit has (a) an address counter for holding a row address specifying one row to be refreshed in the memory cell array and (b) a row decoder for selecting one of a plurality of word lines in the memory cell array according to the row address held in the address counter. In accordance with the present invention, the row address held in the address counter responds to termination of the refresh of the row specified by the row address and is updated after a time required for placing the selected word line into a non-selected state has elapsed. Such arrangement makes it possible to make early decision of the address of the next row before subjecting it to refresh.

The refresh control circuit has (a) a flip-flop circuit for setting and resetting a timing signal which controls refresh of one row in the memory cell array in response to set and reset pulses received, respectively, (b) an oscillation circuit for generating a clock pulse train as long as the self-refresh mode signal is maintained at the second logical level, (c) a set pulse generation circuit for generating, based on the clock pulse train generated by the oscillation circuit, the set pulse to be applied to the flip-flop circuit, and (d) a reset pulse generation circuit for generating, based on the timing signal set by the flip-flop circuit, the reset pulse to be applied to the flip-flop circuit.

In accordance with the present invention, the oscillation circuit has means for generating, at the moment the self-refresh mode signal makes a transition from the first logical level to the second logical level, a leading edge of the first pulse in the clock pulse train, for accelerating the beginning of the first operation in a self-refresh mode. More specifically, the oscillation circuit has (a) an even number of inverters connected together in a cascade of stages, (b) a capacitor having a first terminal coupled to an output of an inverter of the even number of inverters that is disposed at the last cascade stage, (c) a logical gate for outputting a given logical level as long as the self-refresh mode signal is maintained at the first logical level and for inverting an output of the last cascade stage inverter and outputting the inverted output as long as the self-refresh mode signal is maintained at the second logical level, (d) a first resistor for coupling an output of the logical gate to a second terminal of the capacitor, (e) a second resistor for coupling the second terminal of the capacitor to an input of an inverter of the even number of inverters that is disposed at the first cascade stage, and (f) a transistor for providing the same logical level as the given logical level to the input of the first cascade stage inverter as long as the self-refresh mode signal is maintained at the first logical level. Such arrangement provides the convenience that whenever the self-refresh mode signal makes a transition from the first logical level to the second logical level, the oscillation circuit starts operating always from its initial state in which a voltage across the capacitor is zero.

The set pulse generation circuit has a one-shot pulse generation circuit for generating, from the clock pulse train generated by the oscillation circuit, a plurality of pulses, each of the plurality of pulses having a given pulse width and serving as the set pulse. The set pulse generation circuit may further have a frequency division circuit for outputting to the one-shot pulse generation circuit a frequency-divided clock pulse train produced by reducing a repetition frequency of the clock pulse train generated by the oscillation circuit as long as the self-refresh mode signal is maintained at the second logical level and for resetting output of the frequency-divided clock pulse train as long as the self-refresh mode signal is maintained at the first logical level.

In accordance with the present invention, the flip-flop circuit has a reset priority circuit for resetting the timing signal within a period specified by a pulse width of the reset pulse, even when the flip-flop circuit receives the set pulse. Such arrangement prevents the timing signal, i.e., individual refresh request signal pulses in a self-refresh mode, from not being reset erroneously. In this case, it is preferable for the reset pulse generation circuit to include means for generating a leading edge of the reset pulse by delaying a leading edge of a pulse of the timing signal by a first delay time and for generating, upon generation of a trailing edge of the timing signal pulse by the flip-flop circuit in response to the reset pulse, a trailing edge of the reset pulse by delaying the trailing edge of the timing signal pulse by a second delay time shorter than the first delay time. This is to accelerate the beginning of the first refresh operation in a following self-refresh mode.

DETAILED DESCRIPTION OF THE INVENTION

Embodiments of semiconductor memories in accordance with the present invention will be described below with reference to the attached drawing figures.

Figure 1:
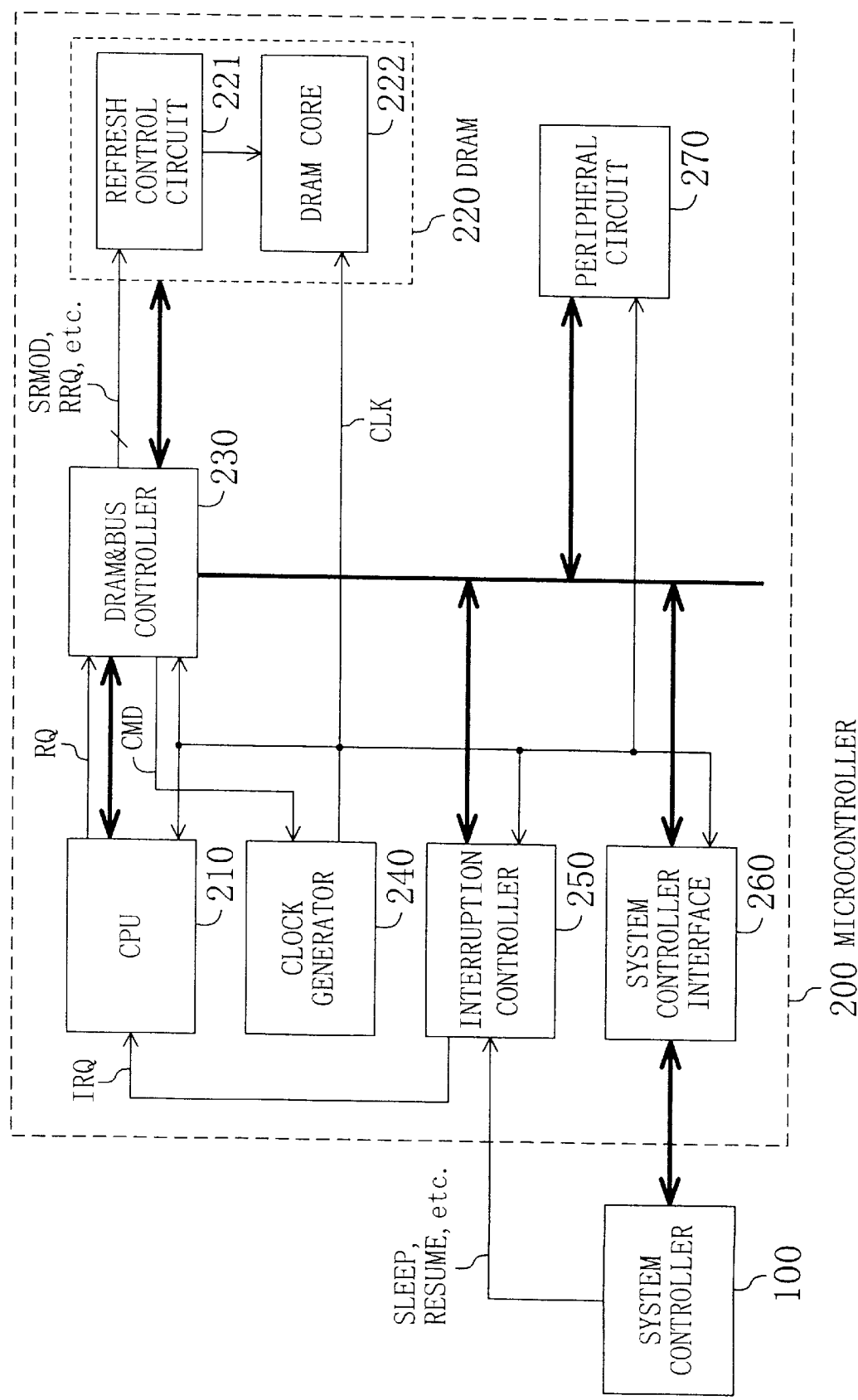
FIG. 1 is a block diagram illustrating a structure of a microcontroller which incorporates a DRAM in accordance with the present invention.

Referring first to FIG. 1, there is shown the structure of a microcontroller that incorporates a DRAM in accordance with the present invention. Two different controllers shown in the figure, i.e., a system controller 100 and a microcontroller 200, are mounted on respective semiconductor chips. For example, both of these controllers 100 and 200 are incorporated into a video equipment. In accordance with this example, the system controller 100 is in charge of controlling the entire video equipment. For control of, for example, a motor provided in the video equipment, the microcontroller 200 is made up of many circuit blocks mounted on a single semiconductor chip and including a CPU (central processing unit) 210, a DRAM 220, a DRAM&BUS controller 230, a clock generator 240, an interruption controller 250, a system controller interface 260, and a peripheral circuit 270. Thick lines in the figure indicate buses used for address and data transfer. The DRAM 220 has a refresh control circuit 221 and a DRAM core 222 having a memory cell array needing refresh.

In a normal mode of the microcontroller 200, the clock generator 240 provides a clock (CLK) pulse train to each of the circuit blocks including the DRAM 220. The CPU 210 is capable of exchanging data with the system controller 100 through the DRAM&BUS controller 230 and the system controller interface 260. Additionally, the CPU 210 is able to access the DRAM 220 through the DRAM&BUS controller 230. At this time, the DRAM&BUS controller 230, which has a function of operating as a logic circuit for controlling memory access, provides to the DRAM 220 control signals including a RAS signal, a CAS signal, a write enable (WE) signal, and a refresh request (RRQ) signal for auto-refresh control. Additionally, in the normal mode, it is arranged such that the DRAM 220 is fed a self-refresh mode (SRMOD) signal which is set LOW. A bus connecting between the DRAM 220 and the DRAM&BUS controller 230 is used for address and data transfer.

Upon receipt of a SLEEP signal from the system controller 100, the microcontroller 200 enters a power-down mode. Upon receipt of the SLEEP signal, the interruption controller 250 provides an interrupt request (IRQ) signal to the CPU 210. In response to the IRQ signal, the CPU 210 provides to the DRAM&BUS controller 230 a request (RQ) signal indicative of a clock-stop. In response to the RQ signal, the DRAM&BUS controller 230 provides plural pulses of the RRQ signal to the DRAM 220 for a given-length transition period. Thereafter, the SRMOD signal is set HIGH by the DRAM&BUS controller 230, which causes the DRAM 220 to enter a self-refresh mode. Thereafter, the DRAM&BUS controller 230 sends to the clock generator 240 a command (CMD) signal which is a clock-stop command. The clock generator 240 responds to the CMD signal by stopping providing the CLK pulse train. Accordingly, no access will be made to the DRAM 220.

In a power-down mode, upon receipt of a RESUME signal from the system controller 100, the microcontroller 200 returns to the normal mode. At this time, the DRAM&BUS controller 230 sets the SRMOD signal at LOW to release the DRAM's 220 self-refresh mode and thereafter provides the CMD signal which is a clock generation start command to the clock generator 240.

Figure 2:
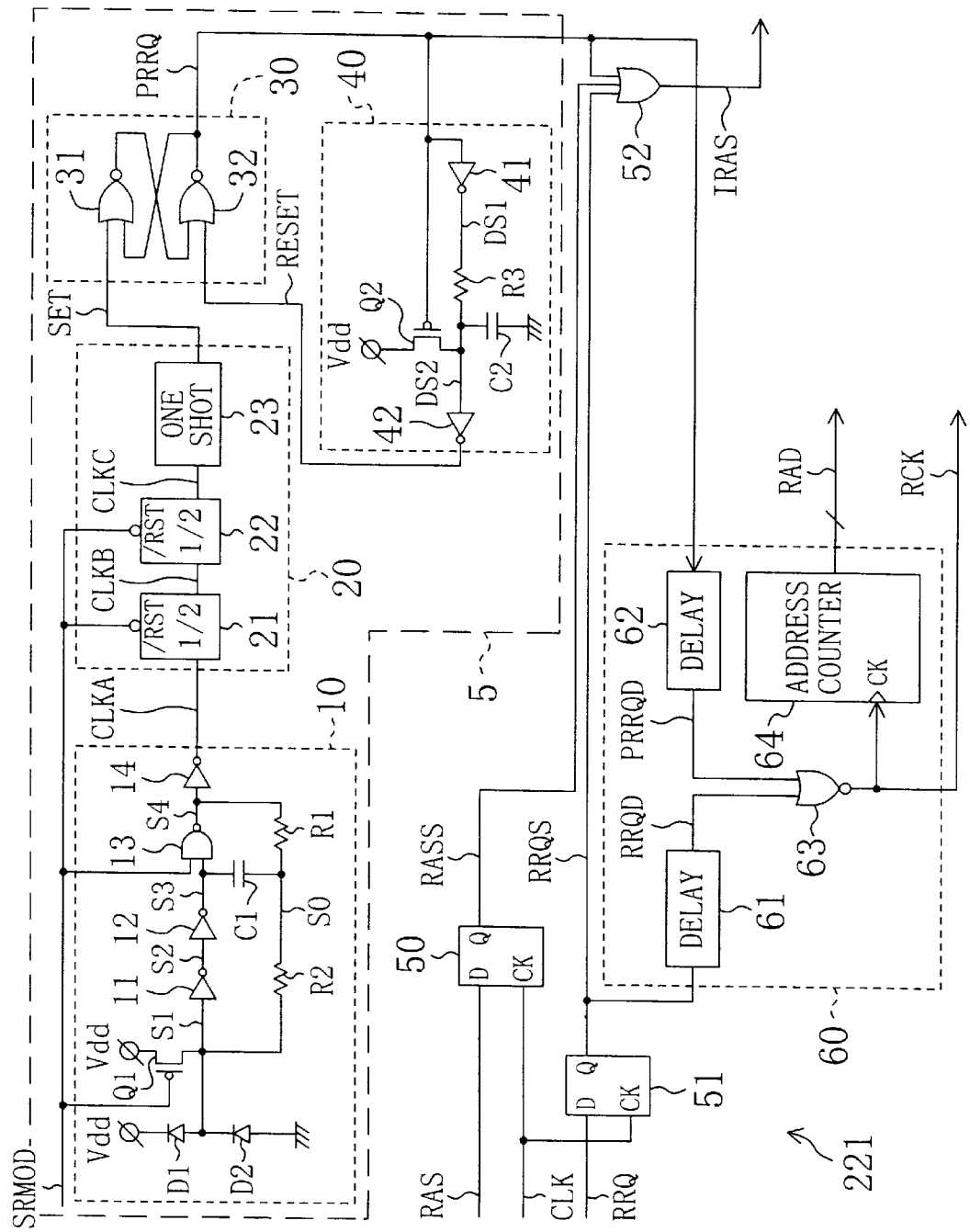
FIG. 2 is a block diagram illustrating an internal structure of a refresh control circuit as shown in FIG. 1.

Referring now to FIG. 2, there is shown an internal structure of the refresh control circuit 221. The refresh control circuit 221 has three mutually independent terminals for receiving the RAS, RRQ, and SRMOD signals from the DRAM&BUS controller 230 and another terminal for receiving the CLK pulse train from the clock generator 240. In addition to these terminals, the refresh control circuit 221 further has a self-refresh control circuit 5, two D-type flip-flops 50 and 51, a single OR gate 52, and a row address generation circuit 60. The self-refresh control circuit 5, which is implemented by a timer for automatically generating a periodic refresh request (PRRQ) signal, has an oscillation circuit 10 for generating an oscillation clock (CLKA) pulse train, a set pulse generation circuit 20 for generating SET pulses, a flip-flop circuit 30 for generating the PRRQ signal, and a reset pulse generation circuit 40 for generating RESET pulses. The D-type flip-flop 50 is means for synchronizing the RAS signal to the CLK pulse train. The D-type flip-flop 51 is means for synchronizing the RRQ signal to the CLK pulse train. An RASS signal, shown in the figure, is the RAS signal synchronized. An RRQS signal, shown in the figure, is the RRQ signal synchronized. The OR gate 52 provides to the DRAM core 222 an internal RAS (IRAS) signal which is a logical sum signal of RASS, RRQS, and PRRQ. The row address generation circuit 60 automatically generates from the RRQS signal or PRRQ signal a row address (RAD) signal indicative of a refresh address. The RAD signal thus generated and a row clock (RCK) pulse indicative of generation timing of the RAD signal are delivered to the DRAM core 222. The row address generation circuit 60 is made up of two delay circuits 61 and 62, a single NOR gate 63, and a single address counter 64. An RRQD signal results from delaying the RRQS signal in the delay circuit 61. A PRRQD signal results from delaying the PRRQ signal in the delay circuit 62. The NOR gate 63 generates RCK pulses from RRQD and PRRQD. The address counter 64 holds a refresh address, i.e., a row address for specifying one row in the memory cell array to be refreshed. This row address is updated in synchronization with a rising edge of the RCK pulse.

How four different circuits 10, 20, 30, and 40 together forming the self-refresh control circuit 5 are constructed will be described below in detail.

The oscillation circuit 10, which generates the CLKA pulse train as long as the SRMOD signal is maintained at HIGH, is operable to generate a leading edge of the first pulse of the CLKA pulse train at the moment the SRMOD signal makes a transition in level from LOW to HIGH. The oscillation circuit 10 has first and second inverters 11 and 12 connected together in cascade, a capacitor C1 with a first terminal coupled to an output of the second inverter 12, a NAND gate 13 which provides a given HIGH level as long as the SRMOD signal is maintained at LOW and which inverts the output of the second inverter 12 and provides the inverted output as long as the SRMOD signal is maintained at HIGH, a third inverter 14 for generating the CLKA pulse train by inverting the output of the NAND gate 13, a first resistor R1 for coupling the output of the NAND gate 13 to a second terminal of the capacitor C1, a second resistor R2 for coupling the second terminal of the capacitor C1 to an input of the first inverter 11, a P-channel MOS (PMOS) transistor Q1 for providing a given HIGH level to the input of the first inverter 11 as long as the SRMOD signal is maintained at LOW, and diodes D1 and D2 for clamping the input of the first inverter 11. In the figure, Vdd indicates a power supply voltage. S0 indicates a signal at the second terminal of the capacitor C1. S1 indicates an input signal of the first inverter 11. S2 indicates an input signal of the second inverter 12. S3 indicates a signal at the first terminal of the capacitor C1. S4 indicates an input signal of the third inverter 14.

The set pulse generation circuit 20 generates, based on the CLKA pulse train generated by the oscillation circuit 10, a SET pulse to be applied to the flip-flop circuit 30. The set pulse generation circuit 20 has a frequency division circuit made up of two frequency dividers 21 and 22, and a one-shot pulse generation circuit 23. The frequency division circuit outputs a frequency-divided clock (CLKC) pulse train produced by reducing a repetition frequency of the CLKA pulse train to a quarter of the frequency as long as the SRMOD signal is maintained at HIGH, and resets output of the CLKC pulse train as long as the SRMOD signal is maintained at LOW. The one-shot pulse generation circuit 23 generates a plurality of pulses, each generated pulse having a given pulse width and serving as the SET pulse. An intermediate frequency-divided clock (CLKB) pulse train, which is supplied from the first stage frequency divider 21 to the second stage frequency divider 22, is produced by reducing a repetition frequency of the CLKA pulse train to a half of the frequency.

The flip-flop circuit 30 is for the setting and resetting of a timing signal for controlling refresh of one row in the memory cell array, i.e., the PRRQ signal, in response to the SET and RESET pulses received. The flip-flop circuit 30 has a reset priority circuit for resetting the PRRQ signal within a period specified by a pulse width of the RESET pulse even when the SET pulse is received. The flip-flop circuit 30 is made up of first and second NOR gates 31 and 32. The first NOR gate 31 is fed a SET pulse and an output of the second NOR gate 32. The second NOR gate 32 is fed a RESET pulse and an output of the first NOR gate 31. The output of the second NOR gate 32 is the PRRQ signal.

The reset pulse generation circuit 40 generates, based on the PRRQ signal set by the flip-flop circuit 30, a RESET pulse to be applied to the flip-flop circuit 30. The reset pulse generation circuit 40 has means for generating a leading edge of the RESET pulse by delaying a leading edge of a pulse of the PRRQ signal by a first delay time and for generating, upon generation of a trailing edge of the PRRQ signal pulse by the flip-flop circuit 30 in response to the RESET pulse, a trailing edge of the RESET pulse by delaying the trailing edge of the PRRQ signal pulse by a second delay time shorter than the first delay time. The structure of the reset pulse generation circuit 40 is described in detail. The reset pulse generation circuit 40 has a first inverter 41 for inverting the PRRQ signal, a resistor R3 having a first terminal coupled to an output of the first inverter 41, a capacitor C2 having a first terminal coupled to a second terminal of the resistor R3 and a second terminal coupled to ground, a PMOS transistor Q2 for applying a given HIGH level to the first terminal of the capacitor C2 as long as the PRRQ signal is maintained at LOW, and a second inverter 42 for generating a RESET pulse by inverting a signal at the first terminal of the capacitor C2. In the figure, Vdd indicates the power supply voltage. DS1 indicates an output signal of the first inverter 41. DS2 indicates an input signal of the second inverter 42.

Figure 3:
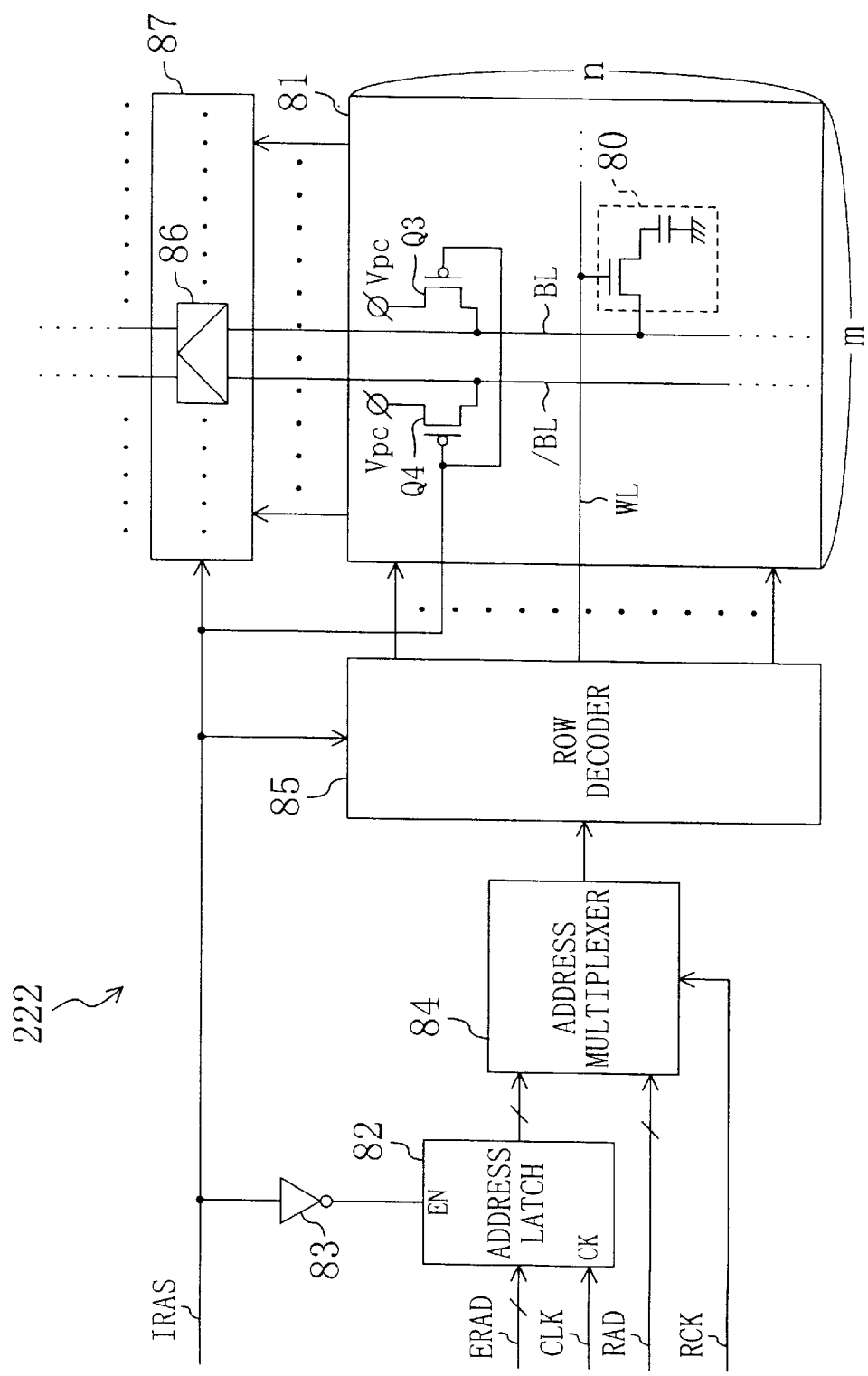
FIG. 3 is a block diagram illustrating an internal structure of a DRAM core as shown in FIG. 1.

Referring now to FIG. 3, there is shown an internal structure of the DRAM core 222. The DRAM core 222 has a memory cell array 81 of dynamic memory cells forming a matrix of n rows by m columns (each number n and m is an integer). FIG. 3 illustrates a single dynamic memory cell 80 as an example dynamic memory cell. The dynamic memory cell 80, coupled to one of a pair of bit lines BL and /BL, is selected together with other dynamic memory cells belonging in the same row through a single word line WL. In the same way, dynamic memory cells belonging in another row are selected. The DRAM core 222 has an address latch 82, an inverter 83, an address multiplexer 84, a row decoder 85, and a differential amplification block 87 formed by a plurality of sense amplifiers 86 for respectively amplifying slight differences in voltage between the bit lines BL and /BL. The address latch 82 and the inverter 83 are constructed such that an external row address (ERAD) signal, received from the DRAM&BUS controller 230 for normal access, is latched in synchronism with a rising edge of the CLK pulse while the IRAS signal is maintained at LOW. The address multiplexer 84 selects between the RAD signal and the ERAD signal. More specifically, the address multiplexer 84 selects the RAD signal received from the address counter 64 as long as the RCK pulse is maintained at LOW, while on the other hand, the address multiplexer 84 selects the ERAD signal latched by the address latch 82 as long as the RCK pulse is maintained at HIGH. In response to the IRAS signal, the row decoder 85 selects one of n word lines in the memory cell array 81 according to the RAD or ERAD signal supplied from the address multiplexer 84. PMOS transistors Q3 and Q4 are provided so that the bit lines BL and /BL are precharged while the IRAS signal is held at LOW. In the figure, Vpc indicates a precharge voltage. The CAS and WE signals and a data bus are not shown in the figure.

Figure 4:
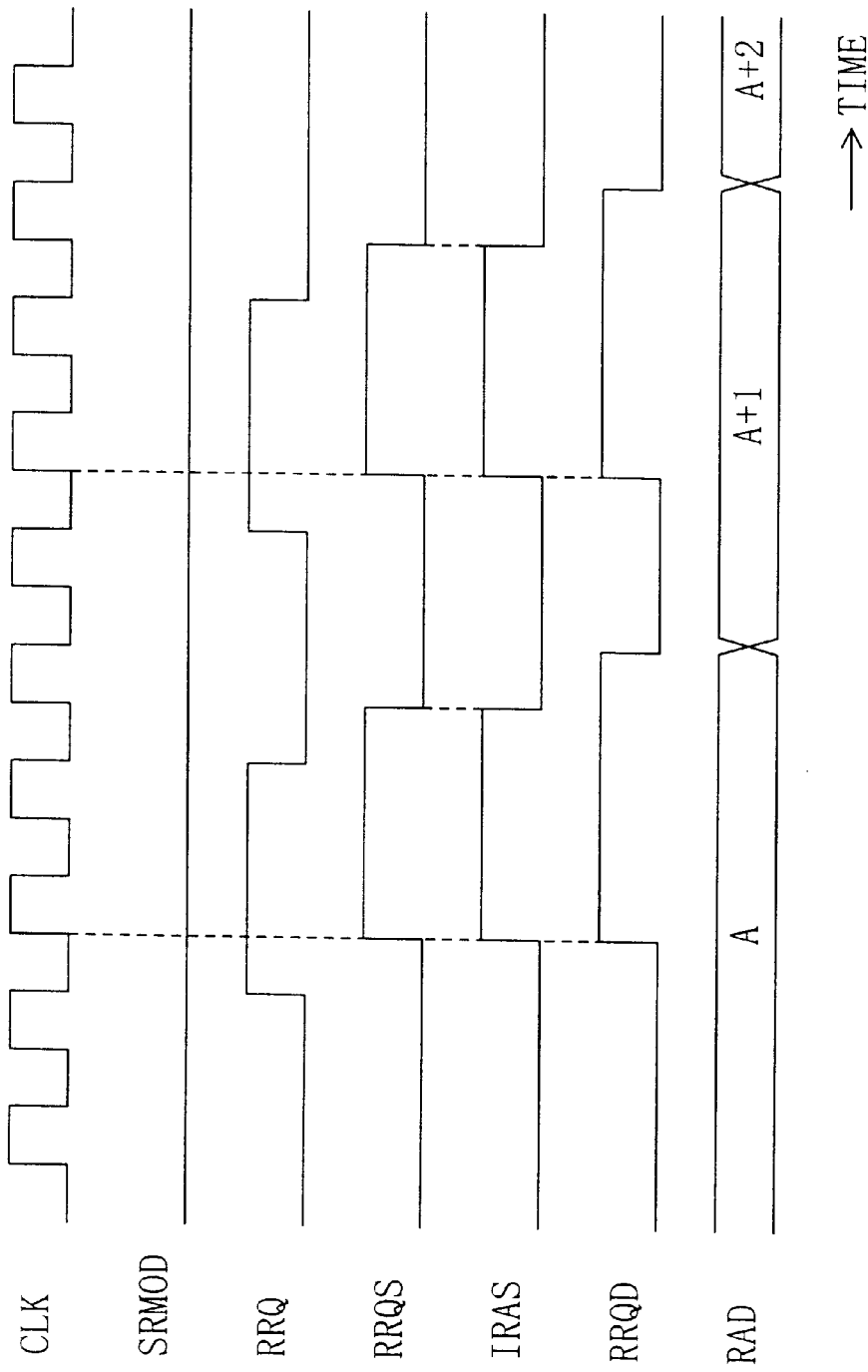
FIG. 4 is a timing chart diagram illustrating an example operation of the refresh control circuit of FIG. 2.

Referring now to FIG. 4, there is shown an example operation of the refresh control circuit 221. In this example operation, in a transition period of the microcontroller 200 from a normal to a power-down mode, plural RRQ signal pulses are sent, together with a CLK pulse train, to the refresh control circuit 221. The level of the SRMOD signal is fixed at LOW. In this case, the RRQS signal remains unaltered to become the IRAS signal and refresh per row in the memory cell array 81 is performed. The addresses, represented by the RAD signal, are updated in synchronism with the falling edges of the RRQD signal, i.e., the rising edges of the RCK pulses, to A, A+1, A+2, and so on in that order. In a period during which the IRAS signal is held at LOW, the bit lines BL and /BL are precharged (equalized) because the PMOS transistors Q3 and Q4 are in the ON state (see FIG. 3). When the IRAS signal makes a transition from LOW to HIGH, the PMOS transistors Q3 and Q4 turn off and the row decoder 85 decodes the RAD signal. This results in selecting one word line (WL), and a bit, stored in the dynamic memory cell 80 coupled to the selected word line WL, is read onto the bit line BL. At this time, a slight voltage difference occurring between the bit lines BL and /BL is amplified by the sense amplifier 86 and rewrite of the stored bit to the dynamic memory cell 80 is carried out. The above-described operation is called "refresh". Other dynamic memory cells, coupled to the selected word line WL, are also subject to refresh. Generation of a rising edge of the RCK pulse is carried out as follows. That is, an RCK pulse rising edge is generated when a given period of time, which is determined by the characteristic of the delay circuit 61 of FIG. 2, has elapsed after one row is refreshed in the way described above. Note that although normal access of the memory cell array 81 is made using the ERAD, RAS, CAS, and WE signals, the description thereof is not made here.

Figure 5:
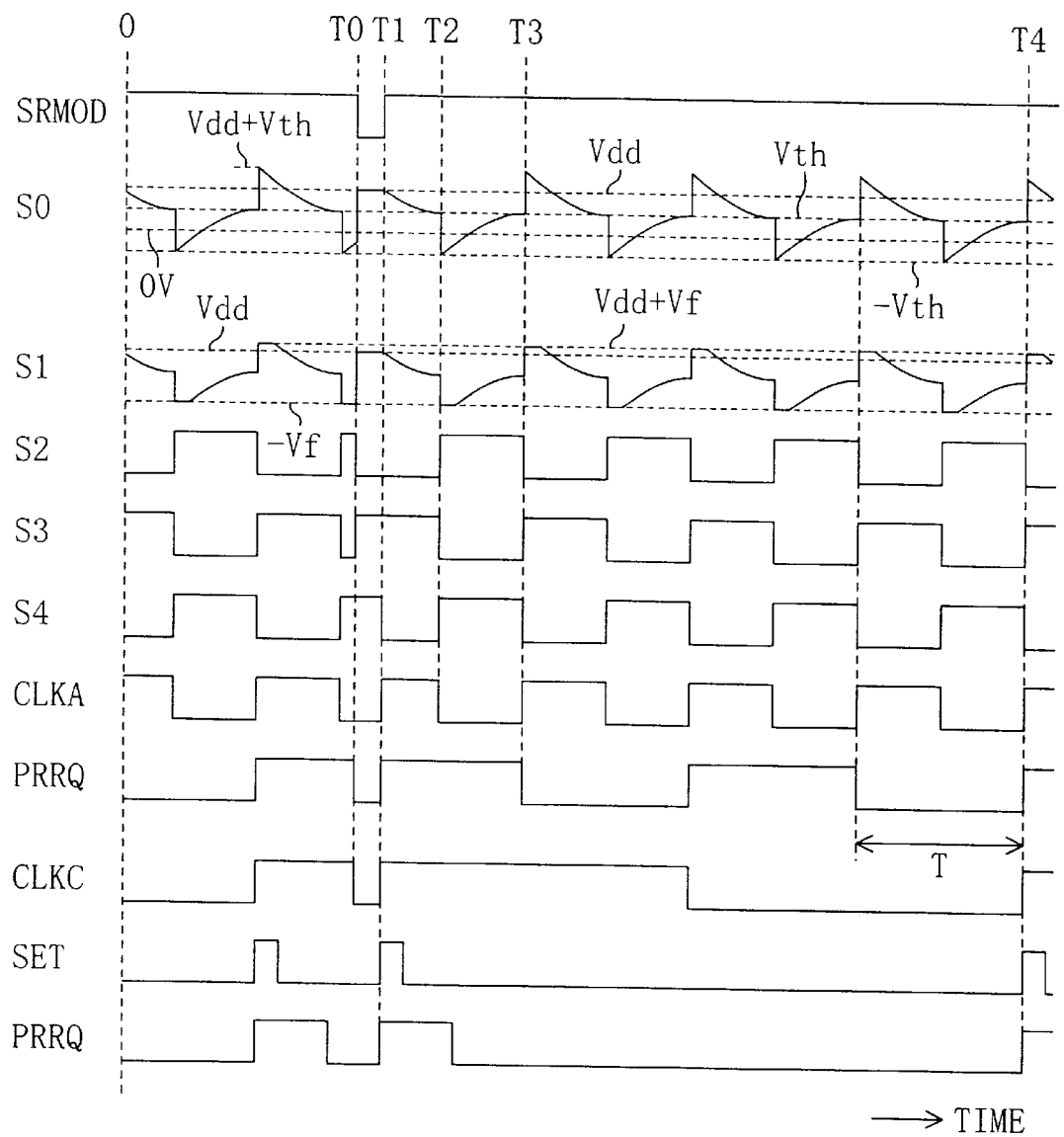
FIG. 5 is a timing chart diagram illustrating another example operation of the refresh control circuit of FIG. 2.

Referring to FIG. 5, there is shown another example operation of the refresh control circuit 221. In this example operation, in a power-down mode of the microcontroller 200, the setting of a self-refresh mode of the DRAM 220 is instantaneously released. Even in such a case, in response to transition of the SRMOD signal from LOW to HIGH, refresh of plural rows in the memory cell array 81 immediately begins. The RRQ signal is fixed at LOW and a supply of the CLK pulse train is being stopped. When the SRMOD signal makes a transition from HIGH to LOW at time T0, the PMOS transistor Q1 disposed within the oscillation circuit 10 turns on. Accordingly, there is made a transition to a state in which S0=S1=S3=S4=HIGH (=Vdd) and S2=LOW, regardless of the state of the oscillation circuit 10 prior to time T0. In such a state, the voltage across the capacitor C1 is zero, as result of which oscillation stops. The relation that CLKA=CLKB=CLKC=LOW holds. Thereafter, at time T1, the SRMOD signal makes a transition to HIGH from LOW, thereby causing the S4 signal to fall. As a result, leading edges (rising edges) of each pulse CLKA, CLKB, and CLKC are generated to generate one SET pulse having a given pulse width. Accordingly, at time T1, the PRRQ signal makes a transition to HIGH from LOW. This PRRQ signal is reset after an elapse of a given time. On the other hand, in response to transition of the SRMOD signal from LOW to HIGH at time T1, the PMOS transistor Q1 turns off. Accordingly, the level of the S0 and S1 signals gradually falls as the second terminal of the capacitor C1 discharges. A time constant of the discharge is determined by the resistor R1 and the capacitor C1. When time T2 is reached so that the level of the S1 signal becomes identical with the threshold voltage (Vth) of the first inverter 11, the S2 signal makes an inversion from LOW to HIGH. Because of this, the S3 signal makes an inversion from HIGH to LOW. The S4 signal makes an inversion from LOW to HIGH. The CLKA pulse makes an inversion from HIGH to LOW. The level of the S0 signal changes to −Vth. Accordingly, after time T2, the second terminal of the capacitor C1 is charged and the level of the S0 signal gradually increases according to the time constant. When time T3 is reached so that the level of the S1 signal becomes identical with the threshold voltage Vth, the S2 signal makes an inversion from HIGH to LOW. Because of this, the S3 signal makes an inversion from LOW to HIGH, the S4 signal makes an inversion from HIGH to LOW, the CLKA pulse makes an inversion from LOW to HIGH, and the CLKB pulse makes an inversion from HIGH to LOW. The level of the S0 signal changes to Vdd+Vth. Accordingly, after time T3, the second terminal of the capacitor C1 discharges and the level of the S0 signal gradually decreases according to the time constant to return to the same state as at time T2. In the same way as describe above, the CLKA pulse train having a given repetition frequency of 1/T is generated. Each of the CLKA, CLKB, and CLKC pulses rises when time T4 is reached and another SET pulse is generated. Accordingly, at time T4, the PRRQ signal makes a transition to HIGH from LOW. In the same way as described above, the PRRQ signal having a repetition frequency of ¼ of 1/T is generated. As shown in FIG. 5, the upper limit of the level of the S1 signal is clamped to Vdd+Vf and the lower limit is clamped to −VT, where Vt indicates the voltage of the diodes D1 and D2 in the forward direction.

As describe above, in accordance with the refresh control circuit 221 shown in FIG. 2, a rising edge of the PRRQ signal is immediately generated in response to transition of the SRMOD signal from LOW to HIGH at time T1. Therefore, the first refresh operation begins at once. Thereafter, the periodic refresh request (PRRQ) signal satisfying a refresh interval of 4T is automatically generated. The refresh interval 4T is determined in consideration of the data holding characteristic of the dynamic memory cells.

Figure 6:
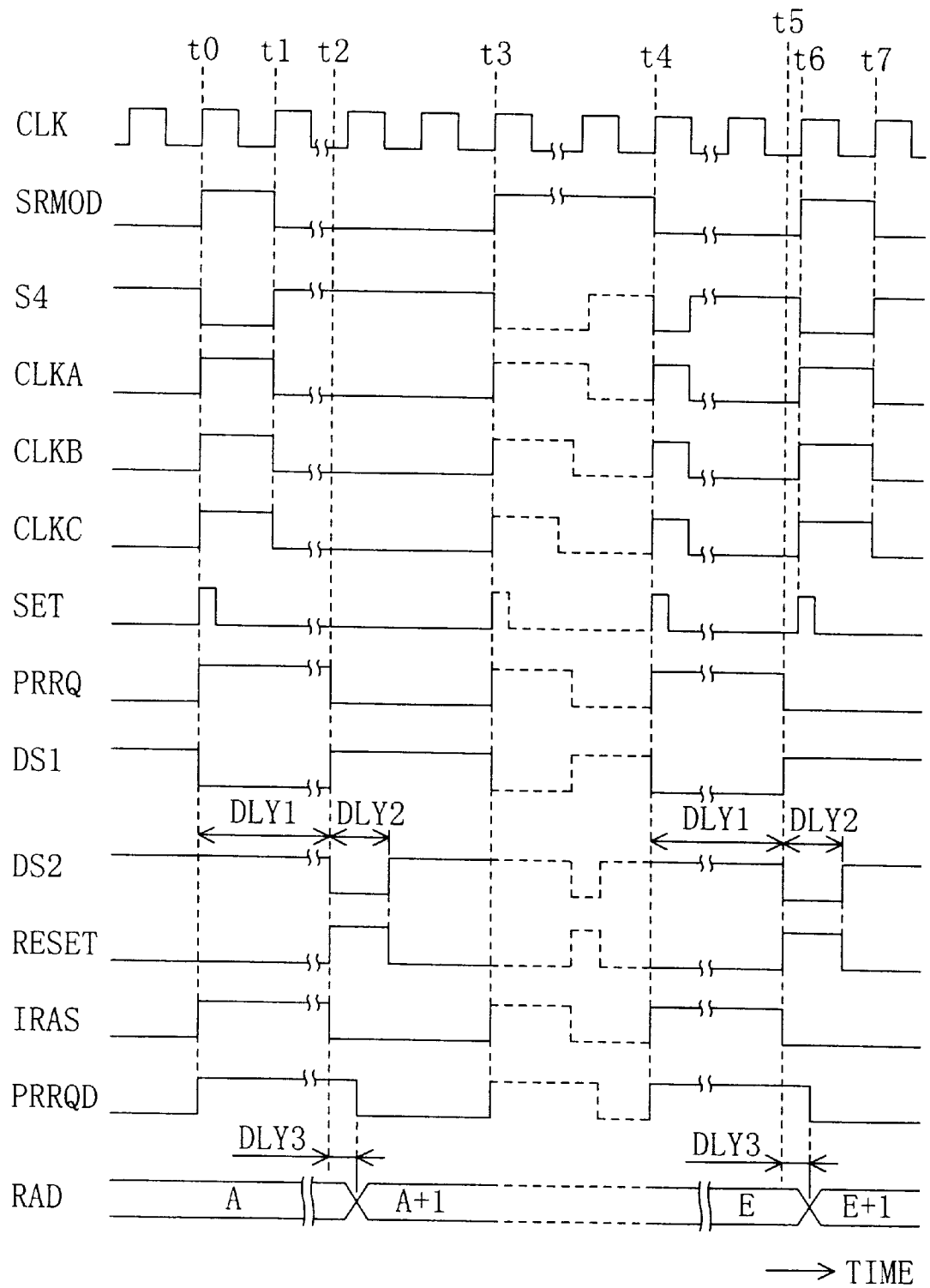
FIG. 6 is a timing chart diagram illustrating still another example operation of the refresh control circuit of FIG. 2.

Referring to FIG. 6, there is shown still another example operation of the refresh control circuit 221. In this example operation, in a normal mode of the microcontroller 200, the setting of a self-refresh mode of the DRAM 220 is instantaneously established. Even in such a case, destruction of data stored in the memory cell array 81 is avoided. In some situations, the level of the SRMOD signal is set HIGH for a short period of time from time t0 to time t1. Such a situation may occur when the RESUME signal is supplied immediately after the microcontroller 200 is about to enter a power-down mode in response to the SLEEP signal. When the SRMOD signal makes a transition from LOW to HIGH at time t0, the S4 signal falls as in the case of time T1 of FIG. 5. Leading edges (rising edges) of each of the CLKA, CLKB, and CLKC pulses are generated, as a result of which one SET pulse having a given pulse width is generated. Accordingly, at time t0, the PRRQ signal makes a transition to HIGH from LOW and the IRAS signal makes a transition to HIGH from LOW. When the level of the PRRQ signal assumes HIGH, the PMOS transistor Q2 disposed within the reset pulse generation circuit 40 turns off. Accordingly, the pulse delay time in the reset pulse generation circuit 40 is a time DLY1 that is determined by a time constant based on the resistor R3 and the capacitor C2. In other words, the reset pulse generation circuit 40 causes a delay of DLY1 to a leading edge (rising edge) of a pulse of the PRRQ signal at time t0 to generate a leading edge (rising edge) of the RESET pulse at time t2. In response to the RESET pulse which was set HIGH in the above-described way, the flip-flop circuit 30 generates a trailing edge (falling edge) of the PRRQ signal pulse. Accordingly, the IRAS signal will be held HIGH for the same period of time as DLY1, regardless of how short a period of time from time t0 to time t1 is. When the level of the PRRQ signal becomes LOW, the PMOS transistor Q2 disposed within the reset pulse generation circuit 40 turns on. Accordingly, the pulse delay time in the reset pulse generation circuit 40 is a time DLY2 (<DLY1) not depending on the resistor R3. In other words, the reset pulse generation circuit 40 causes a delay of DLY2 to a falling edge of the PRRQ signal to generate a trailing edge (falling edge) of the RESET pulse. The time DLY1 is set above a value required for all the dynamic memory cells belonging in a specified row in the memory cell array 81 to be refreshed. On the other hand, the time DLY2 is set above a value required for the bit lines BL and /BL to be precharged. The address represented by the RAD signal is updated from A to A+1 in synchronism with the falling edge of the PRRQD signal. The updating of the RAD signal is delayed by a pulse delay time DLY3 of the delay circuit 62 from time t2. The time DLY3 is set above a value required for placing a selected word line into a non-selected state in order to avoid word line multiple selection in the memory cell array 81.

As described above, early generation of a RESET pulse trailing edge is made possible at the moment a time equal to the time DLY2 has elapsed from time t2, which makes it possible for the flip-flop circuit 30 to accept a SET pulse immediately after such generation. The FIG. 6 example shows that at time t3, the SRMOD signal makes a transition to HIGH from LOW, the SET pulse is accepted by the flip-flop circuit 30, and the DRAM 220 enters its self-refresh mode. Further, in the FIG. 6 example, responding to the last SET pulse generated at time t4 in the final stage of the self-refresh mode, the RESET pulse is maintained at HIGH from time t5. Such a situation is assumed that the SRMOD signal is erroneously made to change to HIGH from LOW at time t6, and then, at time t7, the SRMOD signal makes a transition to LOW from HIGH. In this case, in spite of the fact that a SET pulse is generated at time t6, such a generated SET pulse is ignored because of the provision of a reset priority circuit in the flip-flop circuit 30. A refresh operation of one row relating to the address E (which is activated on the basis of the SET pulse at time t4) terminates by time t5. The address represented by the RAD signal is updated from E to E+1.

The description has been made in terms of a refresh input specification using the RRQ signal and the SRMOD signal that are mutually independent signals. Such a refresh input specification is suitably applicable to integrated type DRAMs mounted, together with other logic circuits such as CPU, on a single semiconductor chip, as in the embodiments described above. The reason is that for the case of integrated type DRAMs, constraints on the number of input pins can be relaxed. However, the refresh input specification of the present invention is applicable to general-purpose DRAMs as the pin number permits.

What is claimed is:

1. A semiconductor memory comprising:
    (a) a memory cell array needing refresh,
    (b) mutually independent first and second terminals, and
    (c) a refresh control circuit coupled to said memory cell array and to said mutually independent first and second terminals,
    said refresh control circuit having:
    means for generating a periodic refresh request signal which generates said periodic refresh request signal in response to a transition of a self-refresh mode signal, applied to said second terminal, from a first logical level to a second logical level, and further generates said periodic refresh request signal periodically as long as said self-refresh mode signal is maintained at said second logical level, and
    means for generating an internal row access signal for accessing a row in said memory cell array in response to a refresh request signal applied to said first terminal and said periodic refresh request signal.

2. The semiconductor memory according to claim 1, wherein said semiconductor memory is implemented by a memory which is formed on a single semiconductor chip together with a logic circuit for applying said refresh request signal and said self-refresh mode signal at said first terminal and at said second terminal, respectively.

3. The semiconductor memory according to claim 1, said refresh control circuit having:
    (a) an address counter for holding a row address specifying one row to be refreshed in said memory cell array, and (
    b) a row decoder for selecting one of a plurality of word lines in said memory cell array according to said row address held in said address counter,
    wherein said row address held in said address counter responds to termination of the refresh of said row specified by said row address and is updated after a time required for placing said selected word line into a non-selected state has elapsed.

4. The semiconductor memory according to claim 1, said refresh control circuit having:
    (a) a flip-flop circuit for setting and resetting a timing signal which controls refresh of one row in said memory cell array in response to set and reset pulses received, respectively,
    (b) an oscillation circuit for generating a clock pulse train as long as said self-refresh mode signal is maintained at said second logical level,
    (c) a set pulse generation circuit for generating, based on said clock pulse train generated by said oscillation circuit, said set pulse to be applied to said flip-flop circuit, and
    (d) a reset pulse generation circuit for generating, based on said timing signal set by said flip-flop circuit, said reset pulse to be applied to said flip-flop circuit.

5. The semiconductor memory according to claim 4, wherein said oscillation circuit has means for generating, at the moment said self-refresh mode signal makes a transition from said first logical level to said second logical level, a leading edge of the first pulse in said clock pulse train.

6. The semiconductor memory according to claim 5, said oscillation circuit having:
    (a) an even number of inverters connected together in a cascade of stages,
    (b) a capacitor having a first terminal coupled to an output of an inverter of said even number of inverters that is disposed at the last cascade stage,
    (c) a logical gate for outputting a given logical level as long as said self-refresh mode signal is maintained at said first logical level and for inverting an output of said last cascade stage inverter and outputting said inverted output as long as said self-refresh mode signal is maintained at said second logical level,
    (d) a first resistor for coupling an output of said logical gate to a second terminal of said capacitor,
    (e) a second resistor for coupling said second terminal of said capacitor to an input of an inverter of said even number of inverters that is disposed at the first cascade stage, and
    (f) a transistor for providing the same logical level as said given logical level to said input of said first cascade stage inverter as long as said self-refresh mode signal is maintained at said first logical level.

7. The semiconductor memory according to claim 4, wherein said set pulse generation circuit has a one-shot pulse generation circuit for generating, from said clock pulse train generated by said oscillation circuit, a plurality of pulses, each of said plurality of pulses having a given pulse width and serving as said set pulse.

8. The semiconductor memory according to claim 7, wherein said set pulse generation circuit further has a frequency division circuit for outputting to said one-shot pulse generation circuit a frequency-divided clock pulse train produced by reducing a repetition frequency of said clock pulse train generated by said oscillation circuit as long as said self-refresh mode signal is maintained at said second logical level and for resetting output of said frequency-divided clock pulse train as long as said self-refresh mode signal is maintained at said first logical level.

9. The semiconductor memory according to claim 4, wherein said flip-flop circuit has a reset priority circuit for resetting said timing signal within a period specified by a pulse width of said reset pulse, even when said flip-flop circuit receives said set pulse.

10. The semiconductor memory according to claim 9, wherein said reset pulse generation circuit has means for generating a leading edge of said reset pulse by delaying a leading edge of a pulse of said timing signal by a first delay time and for generating, upon generation of a trailing edge of said timing signal pulse by said flip-flop circuit in response to said reset pulse, a trailing edge of said reset pulse by delaying said trailing edge of said timing signal pulse by a second delay time shorter than said first delay time.

11. A semiconductor memory comprising:

(a) a memory cell array needing refresh, (b) a refresh control circuit for controlling, when receiving a self-refresh mode signal, refresh of a plurality of rows in said memory cell array in response to transition of said self-refresh mode signal from a first logical level to a second logical level, said refresh control circuit having:

an oscillation circuit for generating a clock pulse train as long as said refresh mode signal is maintained at said second logical level, and said oscillation circuit having:

(a) means for generating, at the moment said self-refresh mode signal makes a transition from said first logical level to said second logical level, a leading edge of the first pulse in said clock pulse train, (b) an even number of inverters connected together in a cascade of stages, (c) a capacitor having a first terminal coupled to an output of an inverter of said even number of inverters that is disposed at the last cascade stage, (d) a logical gate for outputting a given logical level as long as said self-refresh mode signal is maintained at said first logical level and for inverting an output of said last cascade stage inverter and outputting said inverted as long as said self-refresh mode signal is maintained at said second logical level, (e) a first resistor for coupling an output of said logical gate to a second terminal of said capacitor, (f) a second resistor for coupling said second terminal of said capacitor to an input of an inverter of said even number of inverters that is disposed at the first cascade stage, and (g) a transistor for providing the same logical level as said given logical level to said input of said first cascade stage inverter as long as said self-refresh mode signal is maintained at said first logical level.

12. A semiconductor memory comprising:

(a) a memory cell array needing refresh, and (b) a refresh control circuit for controlling, when receiving a self-refresh mode signal, refresh of a plurality of rows in said memory cell array in response to transition of said self-refresh mode signal from a first logical level to a second logical level, said refresh control circuit having:

(i) a flip-flop circuit for setting and resetting a timing signal which controls refresh of one row in said memory cell array in response to set and reset pulses received, respectively, (ii) an oscillation circuit for generating a clock pulse train as long as said self-refresh mode signal is maintained at said second logical level, (iii) a set pulse generation circuit for generating, based on said clock pulse train generated by said oscillation circuit, said set pulse to be applied to said flip-flop circuit, and (iv) a reset pulse generation circuit for generating, based on said timing signal set by said flip-flop circuit, said reset pulse to be applied to said flip-flop circuit, and said flip-flop circuit having:

a reset priority circuit for resetting said timing signal within a period specified by a pulse width of said reset pulse, even when said flip-flop circuit receives said set pulse.

13. The semiconductor memory according to claim 12, wherein said reset pulse generation circuit has means for generating a leading edge of said reset pulse by delaying a leading edge of a pulse of said timing signal by a first delay time and for generating, upon generation of a trailing edge of said timing signal pulse by said flip-flop circuit in response to said reset pulse, a trailing edge of said reset pulse by delaying said trailing edge of said timing signal pulse by a second delay time shorter than said first delay time.

* * * * *